(12) United States Patent
Shibata et al.

(10) Patent No.: US 6,824,610 B2
(45) Date of Patent: Nov. 30, 2004

(54) PROCESS FOR PRODUCING GALLIUM NITRIDE CRYSTAL SUBSTRATE, AND GALLIUM NITRIDE CRYSTAL SUBSTRATE

(75) Inventors: Masatomo Shibata, Tokyo (JP); Naotaka Kuroda, Tokyo (JP)

(73) Assignees: NEC Corporation (JP); Hitachi Cable Ltd. (JP)

( * ) Notice: Subject to any disclaimer, the term of this patent is extended or adjusted under 35 U.S.C. 154(b) by 176 days.

(21) Appl. No.: 10/106,693

(22) Filed: Mar. 26, 2002

(65) Prior Publication Data

US 2002/0175340 A1 Nov. 28, 2002

(30) Foreign Application Priority Data

Mar. 26, 2001 (JP) .................................... 2001-088294

(51) Int. Cl.[7] .............................................. C30B 25/04
(52) U.S. Cl. ........................... 117/89; 117/94; 117/106; 117/915; 117/952
(58) Field of Search ........................... 117/89, 94, 915, 117/106, 952

(56) References Cited

U.S. PATENT DOCUMENTS 6,589,857 B2 * 7/2003 Ogawa et al. ............. 438/502
6,649,494 B2 * 11/2003 Tamura et al. ............. 438/481
2001/0006845 A1 * 7/2001 Kryliouk ..................... 438/607
2002/0020341 A1 * 2/2002 Marchand et al. ............ 117/84

FOREIGN PATENT DOCUMENTS

| JP | 63-188983 | 8/1988 |
| JP | 10-312971 | 11/1998 |
| JP | 2000-012900 | 1/2000 |

OTHER PUBLICATIONS

"Large Free-Standing GaN Substrates by Hyrdride Vapor Phase Epitaxy and Laser-Induced Liftoff" Jpn J, Appl, Phys, vol. 38 (1999) pp L217-L219, Part 2, No. 3A, Mar. 1999.

* cited by examiner

Primary Examiner—Robert Kunemund
(74) Attorney, Agent, or Firm—James B. Conte; Barnes & Thornburg LLP

(57) ABSTRACT

A metal film is deposited on a starting substrate, which is any one of a single crystal sapphire substrate, a substrate comprising a single crystal gallium nitride film grown on a sapphire substrate, and a single crystal semiconductor substrate, and a gallium nitride film is deposited on the metal film to form a laminate substrate. By virtue of the above construction, after the growth of the gallium nitride film, the gallium nitride film can be easily separated from the starting substrate, and a gallium nitride crystal substrate, which has low defect density and has not been significantly contaminated with impurities, can be produced in a simple manner.

14 Claims, 3 Drawing Sheets

PROCESS FOR PRODUCING GALLIUM NITRIDE CRYSTAL SUBSTRATE, AND GALLIUM NITRIDE CRYSTAL SUBSTRATE

BACKGROUND OF THE INVENTION

1. Field of the Invention

The invention relates to a process for producing a gallium nitride crystal substrate, and a gallium nitride crystal substrate.

2. Prior Art

GaN compound semiconductors, such as gallium nitride (GaN), indium gallium nitride (InGaN), and gallium aluminum nitride (GaAlN), have drawn attention as materials for blue light-emitting diodes (LEDs) and laser diodes (LDs). Further, by virtue of good heat resistance and environmental resistance, GaN compound semiconductors have been used in the optical devices, as well as in the development of elements for electronic devices utilizing these features.

In the GaN compound semiconductors, however, it is difficult to grow bulk crystal, and, for this reason, GaN substrates, which can be put to practical use, have not been produced yet. Sapphire is a substrate for the growth of GaN which is presently extensively put to practical use, and it is common practice to epitaxially grow GaN on a single crystal sapphire substrate, for example, by metal-organic vapor phase epitaxy (MOVPE).

The sapphire substrate is different from GaN in lattice constant, and, thus, when GaN is grown directly on the sapphire this problem, Japanese Patent Laid-Open No. 188983/1988 discloses a method wherein a buffer layer of AlN or GaN is once grown at a low temperature on the sapphire substrate, for reducing strain of lattice and GaN is then grown on the buffer layer.

Even in the case of the growth of GaN using the low-temperature grown buffer layer, however, a difference in lattice constant between the substrate and the crystal occurs, and, consequently, GaN has numerous defects which are expected to be an obstacle to the production of GaN-base LDs. Further, due to the difference in a coefficient of linear expansion between the sapphire substrate and GaN, warpage occurs in the substrate after epitaxy, and, in the worst case, the substrate is disadvantageously cracked.

For this reason, the development of GaN bulk substrates has been eagerly desired.

Although the growth of a large bulk GaN crystal is very difficult, a method has recently been proposed wherein a thick film of GaN is heteroepitaxially grown on a substrate, for example, by HVPE and the substrate is then removed to provide a free standing substrate of GaN.

By the way, at the present time, any technique for separating GaN grown on the sapphire substrate by etching has not been developed. Although an attempt to mechanically remove the sapphire substrate by polishing has also been made, the warpage of the substrate is increased in the process of polishing and the probability of cracking of the substrate is high. For this reason, this method has not been put to practical use.

Here Jpn. J. Appl. Phys. Vol. 38 (1999) Pt. 2, No. 3A reports a method wherein, after the growth of a thick GaN film on a sapphire substrate by HVPE, laser pulses are applied to separate only the GaN film. However, this method also is likely to cause cracking of the substrate.

Further, Japanese Patent Laid-Open No. 12900/2000 discloses a method using an easily removable substrate. In this method, a thick GaN film is grown on a GaAs substrate by HVPE and the GaAs substrate is then removed by etching. According to this method, a large GaN substrate can be prepared in a relatively high yield. This method, however, has a problem that the GaAs substrate is disadvantageously decomposed during the growth of the GaN crystal and arsenic (As) is included as an impurity into the GaN.

Selective growth using a patterned mask is effective for reducing the defect density of epitaxially grown GaN, and, for example, Japanese Patent Laid-Open No, 312971/1998 discloses a technique for this. Since, however, there is no method for easily separating the substrate, the above technique cannot be effectively utilized in the production of a free standing substrate of GaN.

SUMMARY OF THE INVENTION

Accordingly, it is an object of the invention to solve the problems of the prior art and to provide a process for producing, in a simple manner, a gallium nitride crystal substrate, which has low defect density and has not been significantly contaminated with impurities, and a gallium nitride crystal substrate produced by the production process.

According to the first feature of the invention, a process for producing a gallium nitride crystal substrate, comprises the steps of:

depositing a metal film on a starting substrate, which is any one of a single crystal sapphire substrate, a substrate comprising a single crystal gallium nitride film grown on a sapphire substrate, and a single crystal semiconductor substrate;

depositing a gallium nitride film on the metal film to form a laminate substrate, and removing the starting substrate from the laminate substrate with the gallium nitride film deposited thereon to prepare a free standing gallium nitride crystal substrate.

According to the second feature of the invention, a process for producing a gallium nitride crystal substrate, comprises the steps of:

depositing a metal film on a starting substrate, which is any one of a single crystal sapphire substrate, a substrate comprising a single crystal gallium nitride film grown on a sapphire substrate, and a single crystal semiconductor substrate;

forming a mask region and a gallium nitride selective growth region formed of a patterned mask material on the metal film;

depositing, using the selective growth region as an origin, a gallium nitride film on the selective growth region and the mask region to form a laminate substrate; and removing the starting substrate from the laminate substrate with the gallium nitride film deposited thereon to prepare a free standing gallium nitride crystal substrate.

According to the third feature of the invention, a process for producing a gallium nitride crystal substrate, comprises the steps of:

depositing a metal film on a starting substrate, which is any one of a single crystal sapphire substrate, a substrate comprising a single crystal gallium nitride film grown on a sapphire substrate, and a single crystal semiconductor substrate;

depositing a gallium nitride film on the metal film;

forming a mask region and a gallium nitride selective growth region formed of a patterned mask material on the gallium nitride film;

again depositing, using the selective growth region as an origin, a gallium nitride film on the selective growth region and the mask region to form a laminate substrate; and removing the starting substrate from the laminate substrate with the gallium nitride film again deposited thereon to prepare a free standing gallium nitride crystal substrate.

According to the fourth feature of the invention, a process for producing a gallium nitride crystal substrate, comprises the steps of:

forming a mask region and a gallium nitride selective growth region formed of a patterned mask material an a starting substrate, which is any one of a single crystal sapphire substrate, a substrate comprising a single crystal gallium nitride film grown on a sapphire substrate, and a single crystal semiconductor substrate;

depositing, using the selective growth region as an origin, a gallium nitride film on the selective growth region and the mask region;

forming a metal film on the gallium nitride film;

again depositing a gallium nitride film on the metal film to form a laminate substrate; and removing the starting substrate from the laminate substrate with the gallium nitride film again deposited thereon to prepare a free standing gallium nitride crystal substrate.

The production processes according to the first to fourth features of the invention having the above respective constructions may further comprise the steps of;

depositing a metal film on a starting substrate, which is the free standing gallium nitride crystal substrate;

depositing a gallium nitride film on the metal film to form a laminate substrate; and removing the starting substrate from the laminate substrate with the gallium nitride film deposited thereon to prepare a free standing gallium nitride crystal substrate.

The production processes according to the first to fourth features of the invention having the above respective constructions may farther comprise the steps of:

depositing a metal film on a starting substrate, which is the free standing gallium nitride crystal substrate;

forming a mask region and a gallium nitride selective growth region formed of a patterned mask material on the metal film;

depositing, using the selective growth region as an origin, a gallium nitride film on the selective growth region and the mask region to form a laminate substrate; and removing the starting substrate from the laminate substrate with the gallium nitride film deposited thereon to prepare a free standing gallium nitride crystal substrate.

The production processes according to the first to fourth features of the invention having the above respective constructions may further comprise the steps of:

depositing a metal film on a starting substrate, which is the free standing gallium nitride crystal substrate;

depositing a gallium nitride film on the metal film;

forming a mask region and a gallium nitride selective growth region formed of a patterned mask material on the gallium nitride film;

again depositing, using the selective growth region as an origin, a gallium nitride film on the selective growth region and the mask region to form a laminate substrate; and removing the starting substrate from the laminate substrate with the gallium nitride film again deposited thereon.

The production processes according to the first to fourth features of the invention having the above respective constructions may further comprise the steps of:

depositing a metal film on a starting substrate, which is the free standing gallium nitride crystal substrate;

forming a mask region and a gallium nitride selective growth region formed of a patterned mask material on the metal film;

depositing, using the selective growth region as an origin, a gallium nitride film on the selective growth region and the mask region to form a laminate substrate; and removing the starting substrate from the laminate substrate with the gallium nitride film deposited thereon to prepare a free standing gallium nitride crystal substrate.

The production processes according to the first to fourth features of the invention having the above respective constructions may further comprise the steps of:

depositing a metal film on a starting substrate, which is the free standing gallium nitride crystal substrate;

depositing a gallium nitride film on the metal film;

forming a mask region and a gallium nitride selective growth region formed of a patterned mask material on the gallium nitride film;

again depositing, using the selective growth region as an origin, a gallium nitride film on the selective growth region and the mask region to form a laminate substrate; and removing the starting substrate from the laminate substrate with the gallium nitride film again deposited thereon to prepare a free standing gallium nitride crystal substrate.

The production processes according to the first to fourth features of the invention having the above respective constructions may further comprise the steps of:

forming a mask region and a gallium nitride selective growth region formed of a patterned mask material on a starting substrate which is the free standing gallium nitride crystal substrate;

depositing, using the selective growth region as an origin, a gallium nitride film on the selective growth region and the mask region;

forming a metal film on the gallium nitride film;

again depositing a gallium nitride film on the metal film to form a laminate substrate; and removing the starting substrate from the laminate substrate with the gallium nitride film again deposited thereon to prepare a free standing gallium nitride crystal substrate.

In the above production processes, the metal film is preferably a metal film having C-axis orientation.

In the above production processes, the metal film is preferably formed of a member selected from the group consisting of aluminum, gold, silver, copper, platinum, iron, nickel, titanium, zirconium, and hafnium and alloys containing any one of said metals.

In the above production processes, preferably, the metal film has a thickness in the range of 10 to 1000 nm.

In the above production processes, preferably, the gallium nitride is deposited to a thickness of not less than 50 $\mu$m.

In the above production processes, aluminum nitride may be deposited on the metal film, followed by the deposition of gallium nitride on the aluminum nitride.

In the above production processes, preferably, a part or the whole of the step of depositing gallium nitride is carried out by HVPE.

In the above production processes, preferably, the step of removing the starting substrate is the step of separating the gallium nitride film from the substrate through the metal In the above production processes, preferably, the gallium nitride film is separated from the starting substrate by etching the metal film.

According to the invention, a metal film is deposited on a starting substrate, which is any one of a single crystal sapphire substrate, a substrate comprising a single crystal gallium nitride film grown on a sapphire substrate, and a single crystal semiconductor substrate, and a gallium nitride film is deposited on the metal film to form a laminate substrate. By virtue of the above construction, after the growth of the gallium nitride film, the single crystal of gallium nitride can be easily separated from the starting substrate.

The separation of the grown single crystal of gallium nitride from the starting substrate can also be facilitated by the adoption of a construction wherein a mask region and a gallium nitride selective growth region formed of a patterned mask material are formed on a metal film, a gallium nitride film is deposited, using the selective growth region as an origin, on the selective growth region and the mask region to form a laminate substrate, and a starting substrate is formed from the laminate substrate.

Further, the separation of the grown single crystal of gallium nitride from the starting substrate can also be facilitated by the adoption of a construction wherein a gallium nitride film is deposited on a metal film, a mask region and a gallium nitride selective growth region formed of a patterned mask material are formed on the gallium nitride film, and a gallium nitride film is again deposited, using the selective growth region as an origin, on the selective growth region and the mask region to form a laminate substrate.

Furthermore, the separation of the grown single crystal of gallium nitride from the starting substrate can also be facilitated by the adoption of a construction wherein a mask region and a gallium nitride selective growth region formed of a patterned mask material are formed on a starting substrate, a gallium nitride film is deposited, using the selective growth region as an origin, on the selective growth region and the mask region, a metal film is formed on the gallium nitride film and a gallium nitride film is again deposited on the metal film to form a laminate substrate.

In particular, not only the facilitation of the separation of the grown single crystal of gallium nitride from the starting substrate but also a further reduction in crystal defects can be realized by the adoption of a construction wherein a metal film is deposited on a starting substrate, which is a free standing gallium nitride crystal substrate, and a gallium nitride film is deposited on the metal film to form a laminate substrate with the gallium nitride film deposited thereon.

In particular, not only the facilitation of the separation of the grown single crystal of gallium nitride from the starting substrate but also a further reduction in crystal defects can be realized by the adoption of a construction wherein a metal film is deposited on a starting substrate, which is a free standing gallium nitride crystal substrate, a mask region and a gallium nitride selective growth region formed of a patterned mask material are formed on the metal film, and a gallium nitride film is deposited, using the selective growth region as an origin, on the selective growth region and the mask region to form a laminate substrate with the gallium nitride film deposited thereon.

In particular, not only the facilitation of the separation of the grown single crystal of gallium nitride from the starting substrate but also a further reduction in crystal defects can be realized by the adoption of a construction wherein a metal film is deposited on a starting substrate, which is the free standing gallium nitride crystal substrate, a gallium nitride film is deposited on the metal film, a mask region and a gallium nitride selective growth region formed of a patterned mask material are formed on the gallium nitride film, a gallium nitride film is then again deposited, using the selective growth region as an origin, on the selective growth region and the mask region to form a laminate substrate with the gallium nitride film again deposited thereon.

In particular, not only the facilitation of the separation of the grown single crystal of gallium nitride from the starting substrate but also a further reduction in crystal defects can be realized by the adoption of a construction wherein a mask region and a gallium nitride selective growth region formed of a patterned mask material are formed on a starting substrate, which is a free standing gallium nitride crystal substrate, a gallium nitride film is deposited, using the selective growth region as an origin, on the selective growth region and the mask region, a metal film is formed on the gallium nitride film, and a gallium nitride film is again deposited on the metal film to form a laminate substrate.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
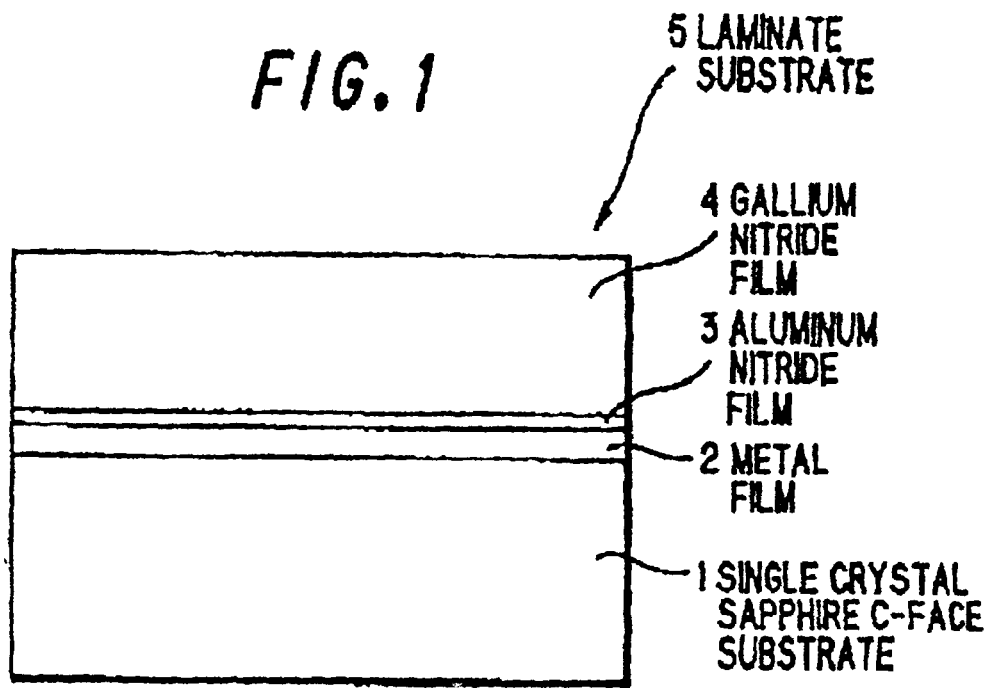
FIG. 1 is a cross-sectional view showing one preferred embodiment of an epitaxially grown gallium nitride laminate substrate to which the production process of a gallium nitride crystal substrate according to the invention has been applied.

Preferred embodiments of the invention will be explained in detail.

The process for producing a gallium nitride crystal substrate according to the invention is characterized by comprising the steps of: providing a starting substrate, which is any one of a single crystal sapphire substrate, a substrate with a single crystal gallium nitride film grown thereon, and a single crystal semiconductor substrate; depositing a metal film, which can be easily removed in a later step, on the starting substrate; and further depositing a gallium nitride film on the metal film. The following properties are required of metal films utilizable in the production process of the invention.

(1) In order to epitaxially grow a single crystal of gallium nitride on a metal film, the metal film should at least have C-axis orientation (a film of a certain cubic metal having (111) crystallographic orientation or a film of a hexagonal metal having (0001) crystallographic orientation can be grown on a C-face or A-face of sapphire or gallium nitride. Further, the same oriented film can also be grown on (111) face of cubic single crystal of silicon, gallium arseniede or the like).

(2) At a gallium nitride growable temperature (500° C. or above), the metal film should be neither melted nor is reacted with a sapphire substrate, gallium nitride, or ammonia gas or hydrogen gas as the growing atmosphere, causing disturbance of C-axis orientation.

(3) The metal film can be reacted with an acid, an alkali or the like, which does not attack gallium nitride, to facilitate the separation of gallium nitride from the laminate substrate.

Metals, which can satisfy the above requirements (1) to (3), include aluminum, gold, silver, copper, platinum, nickel, titanium, zirconium, and halfnium. The use of these metal films can reduce strain derived from a difference in lattice constant or particularly a difference in a coefficient of thermal expansion between the substrate and the gallium nitride film, can reduce the defect density of grown gallium nitride, and, at the same time, can realize the production of a gallium nitride substrate having no significant warpage.

The metal film can be deposited, for example, by vapor deposition, sputtering, or various CVDs. The metal film preferably has a flat surface and covers the whole area of the surface of the substrate. However, even when minute holes are present, gallium nitride can cover the hole and grow over the surface of the metal film.

The mask used in selective growth may be formed of any material on which the crystal of gallium nitride is less likely to be grown, and examples thereof include $SiO_2$ and $SiN_x$.

The following examples further illustrate the invention, but should not be construed as limiting the scope of the invention.

EXAMPLES

Example 1

A 0.1 μm-thick aluminum film was vapor deposited as a metal film on a single crystal sapphire C-face substrate having a diameter of 50.8 mm (about 2 in.) as a starting substrate. The substrate with the aluminum film deposited thereon was analyzed by X-ray diffractometry. As a result, not only a diffraction peak attributable to the (0001) face of sapphire but also a diffraction peak attributable to the (111) face of aluminum was observed, confirming that the aluminum film had C-axis orientation.

This substrate was placed in an MOCVD furnace (metal-organic chemical vapor deposition furnace; not shown) and was heated in a hydrogen atmosphere at 650° C. for 30 min to clean the surface of the substrate and, at the same time, to improve the degree of orientation of aluminum. Subsequently, the growth of a 0.1 μm-thick aluminum nitride film on the surface of the aluminum film was carried out using TMA (trimethylaluminum) and ammonia as starting materials at 650° C. in the same furnace. Further, the substrate temperature was raised to 1050° C., and a gallium nitride film was grown to a thickness of 1 μm using TMG (trimethylgallium) and ammonia as starting materials.

This substrate was transferred into an HVPE furnace, and gallium nitride was deposited on the surface of the substrate to a thickness of 300 μm. In this case, ammonia and gallium chloride were used as starting materials for the growth. The growth was carried out under conditions of pressure=atmospheric pressure, substrate temperature=1050° C., and growth rate=80 μm/hr.

FIG. 1 shows a cross-sectional view showing the structure of the gallium nitride epitaxial laminate substrate thus obtained as a laminate substrate, Specifically, FIG. 1 is a cross-sectional view showing one preferred embodiment of a gallium nitride epitaxial laminate substrate to which the production process of a gallium nitride crystal substrate according to the invention has been applied.

In this drawing, numeral 1 designates a single crystal sapphire C-face substrate as a starting substrate, numeral 2 a metal film having C-axis orientation, numeral 3 an aluminum nitride film, and numeral 4 a gallium nitride film.

The laminate substrate 5, which had been taken out of the HVPE furnace, was immersed in a mixed liquid composed of hydrochloric acid and aqueous hydrogen peroxide. As a result, the aluminum film was selectively etched, and the gallium nitride film 4 was separated from the single crystal C-face sapphire substrate 1. Since a thin layer of aluminum nitride was adhered onto one side (underside in the drawing) of the gallium nitride film 4, this thin layer was removed by polishing with a polishing liquid containing diamond abrasive grains. As a result, a single crystal free standing substrate of gallium nitride was provided.

The single crystal substrate of gallium nitride was measured for warpage. As a result, the radius of curvature of the warpage was about 4 m, confirming that the single crystal substrate was very flat. Further, the surface of the single crystal substrate of gallium nitride was observed by atomic force microscopy to measure the density of surface pits. As a result, the density was as low as $2 \times 10^5$ pits/cm$^2$, confirming that the single crystal substrate of gallium nitride had high crystallinity.

Example 2

A single crystal sapphire C-face substrate having a diameter of 50.8 mm (about 2 in.) as a starting substrate was placed in an MOCVD furnace, and a gallium nitride film was grown at 600° C. to a thickness of 50 nm using TMG and ammonia as starting materials. Thereafter, the temperature of the substrate was raised to 1050° C., and the gallium nitride film was grown to a thickness of 1 μm.

A 0.1 μm-thick gold film as a metal film was vapor deposited on this substrate, followed by analysis by x-ray diffractometry. As a result, a diffraction peak attributable to the (111) face of the gold film was observed, confirming that the gold film had C-axis orientation.

This substrate was placed again in an MOCVD furnace. In this furnace, an aluminum nitride film was grown using TMA and ammonia as starting materials to a thickness of 0.1 μm at a substrate temperature of 850° C. Further, the substrate temperature was raised to 1050° C., and starting materials were changed to TMG and ammonia, followed by the growth of a gallium nitride film to a thickness of 2 μm.

Next, this substrate was transferred into an HVPE furnace and gallium nitride was deposited on the surface of the substrate to a thickness of 300 μm. In this case, ammonia and gallium chloride were used as starting materials for the growth The growth was carried out under conditions of pressure=atmospheric pressure, substrate temperature= 1050° C., and growth rate=80 μm/hr.

The laminate substrate thus obtained was taken out of the HVPE furnace and was immersed in aqua regia approximately overnight to dissolve and remove the gold film, whereby the sapphire substrate could be separated from the gallium nitride film. Thus, a single crystal free standing substrate of gallium nitride was prepared. The surface of the single crystal substrate of gallium nitride was observed by atomic force microscopy to measure the density of surface pits. As a result, the density was as low as $4 \times 10^5$ pits/cm$^2$, confirming that the single crystal substrate of gallium nitride had high crystallinity.

Example 3

A single crystal sapphire C-face substrate having a diameter of 50.8 mm (about 2 in.) was provided as a starting substrate. A silver film was deposited as a metal film by sputtering to a thickness of 200 nm on the substrate. This substrate was placed in an MOCVD furnace, and a gallium nitride film was grown on the surface of the silver film at a substrate temperature of 600° C. to a thickness of 50 nm using TMG and ammonia as starting materials. Thereafter, the temperature of the substrate was raised to 1050° C., and the gallium nitride film wag grown using TMG and ammonia as starting materials to a thickness of 1 μm.

This substrate was then transferred into an HVPE furnaces and gallium nitride was deposited on the surface of the substrate to a thickness of 300 μm, in this case, ammonia and gallium chloride were used as starting materials for the growth The growth was carried out under conditions of pressure=atmospheric pressure, substrate temperature=1050° C., and growth rate=80 μm/hr.

The laminate substrate thus obtained was taken out of the HVPE furnace and was immersed in hot sulfuric acid to dissolve and remove the silver film, whereby the sapphire substrate could be separated from the gallium nitride film. Thus, a single crystal free standing substrate of gallium nitride was prepared.

The surface of the single crystal substrate of gallium nitride was observed by atomic force microscopy to measure the density of surface pits. As a result, the density was as low as $9 \times 10^4$ pits/cm$^2$, confirming that the single crystal substrate of gallium nitride had high crystallinity,

Example 4

A single crystal of gallium nitride was grown by MOCVD to a thickness of 1 μm on a single crystal sapphire C-face substrate having a diameter of 50.8 mm (about 2 in.) as a starting substrate in the same manner as in Example 2. A nickel film as a metal film was vapor deposited on this substrate to a thickness of 0.1 μm, and the deposited substrate was then placed in an MOCVD furnace, where the substrate was heated in a hydrogen atmosphere at 1200° C. for 30 min to clean the surface of the substrate. Subsequently, an aluminum nitride film was grown in the same furnace using TMA and ammonia as starting materials at a temperature of 1060° C. to a thickness of 0.1 μm on the substrate. Next, the starting materials were changed to TMG and ammonia, and a gallium nitride film was grown on the substrate in the same furnace to a thickness of 1 μm.

This substrate was transferred into an HVPE furnace, and gallium nitride was deposited on the surface of the substrate to a thickness of 300 μm. In this case, ammonia and gallium chloride were used as starting materials for the growth. The growth was carried out under conditions of pressure=atmospheric pressure, substrate temperature=1060° C., and growth rate=85 μm/hr. During the growth, dichlorosilane was flowed as a dopant gas to dope silicon into the gallium nitride crystal.

The laminate substrate thus obtained was taken out of the HVPE furnace and was immersed in aqua regia approximately overnight to dissolve and remove the nickel film, whereby the sapphire substrate could be separated from the gallium nitride film. Thus, a single crystal free standing substrate of gallium nitride was prepared.

The carrier density of the single crystal substrate of gallium nitride was measured by the Pauw method and was found to be $8 \times 10^{18}$ cm$^{-3}$. Thus, it was confirmed that a high-carrier density, n-type gallium nitride single crystal substrate was prepared.

The surface of the single crystal substrate of gallium nitride was observed by atomic force microscopy to measure the density of surface pits. As a result, the density was as low as $6 \times 10^5$ pits/cm$^2$, confirming that the single crystal substrate of gallium nitride had high crystallinity.

Example 5

A single crystal sapphire C-face substrate having a diameter of 50.8 mm (about 2 in.) was provided as a starting substrate. Titanium was vapor deposited as a metal film to a thickness of 0.1 μm on the substrate, and gold was then vapor deposited on the deposited substrate to a thickness of 10 to 20 nm for oxidation prevention purposes.

This substrate was placed in an MBE (molecular beam epitaxy) furnace, and a gallium nitride film was grown on the substrate at 700° C. to a thickness of 0.5 μm. This substrate was transferred into an HVPE furnace, and the gallium nitride was further deposited using ammonia and gallium chloride as starting materials on the substrate to a thickness of 300 μm. The growth was carried out under conditions of pressure=atmospheric pressure, substrate temperature=1050° C., and growth rate=80 μm/hr.

The laminate substrate thus obtained was taken out of the HVPE furnace and was immersed in a mixed liquid composed of hydrofluoric acid and nitric acid. As a result, the titanium layer was selectively etched, and the gallium nitride film was separated from the sapphire substrate. Thus, a single crystal tree standing substrate of gallium nitride was prepared.

The surface of the single crystal substrate of gallium nitride was observed by atomic force microscopy to measure the density of surface pits. As a result, the density was as low as $2 \times 10^5$ pits/cm$^2$, confirming that the single crystal substrate of gallium nitride had high crystallinity.

The single crystal free standing substrate of gallium nitride having high crystallinity as such had a high level of warpage due to thermal strain introduced at the time of growth, and the radius of curvature of the warpage was about 70 cm. This substrate was sandwiched between smooth ceramic surface tables (not shown), and, in this state, strain relieving annealing was carried out at 1000° C. for 2 hr. As a result, the radius of curvature of the warpage could be reduced to about 5 m.

Example 6

A silicon (111) substrate having a diameter of 50.8 mm (about 2 in.) was provided as, a starting substrate, and a copper film was vapor deposited as a metal film on the substrate to a thickness of 0.1 μm. This substrate was placed in an MOCVD furnace, where the substrate was heated in a hydrogen atmosphere at 800° C. for 30 min to clean the surface of the substrate and, at the same time, to improve the degree of orientation. Subsequently, an aluminum nitride film was grown in the same furnace using TMA and ammonia as starting materials at a temperature of 800° C. to a thickness of 0.1 μm on the surface of copper. Further, the substrate temperature was raised to 1050° C., and a gallium nitride film was grown using TMG and ammonia as starting materials to a thickness of 1 μm.

This substrate was transferred into an HVPE furnace, and gallium nitride was deposited on the surface of the substrate to a thickness of 300 μm. In this case, ammonia and gallium chloride were used as starting materials for the growth. The growth was carried out under conditions of pressure= atmospheric pressure, substrate temperature=1050° C. and growth rate=80 μm/hr.

The laminate substrate thus obtained was taken out of the HVPE furnace and was immersed in aqua regia approximately overnight to completely dissolve and remove the silicon substrate and the copper film. Since a thin layer of aluminum nitride was adhered onto one side of the gallium nitride layer, this thin layer was removed by polishing with a polishing liquid containing diamond abrasive grains. Thus, a single crystal free standing substrate of gallium nitride was prepared.

The surface of the single crystal substrate of gallium nitride was observed by atomic force microscopy to measure the a density of surface pits. As a result, the density was as low as $2\times10^4$ pits/cm$^2$, confirming that the single crystal substrate of gallium nitride had high crystallinity.

Example 7

A silicon (111) substrate having a diameter of 50.8 mm (about 2 in.) was provided as a starting substrate and was placed in an MOCVD furnace, and an aluminum film was deposited as a metal film at 400° C. on the surface of silicon in a hydrogen atmosphere while flowing TMA to a thickness of 0.2 μm. Subsequently, in the same furnace, the substrate temperature was raised to 600° C., and a gallium nitride film was grown using TMG and ammonia as starting materials on the surface of the aluminum film to a thickness of 0.01 μm. Further, the substrate temperature was raised to 1050° C., and a gallium nitride film was grown using TMG and ammonia as starting materials to a thickness of 2 μm.

This substrate was transferred into an HVPE furnace, and gallium nitride was deposited on the surface of the substrate to a thickness of 300 μm. In this case, ammonia and gallium chloride were used as starting materials for the growth. The growth was carried out under conditions of pressure= atmospheric pressure, substrate temperature=1050° C., and growth rate=80 μm/hr.

The laminate substrate thus obtained was taken out of the HVPE furnace and was immersed in aqua regia approximately overnight to completely dissolve and remove the silicon substrate and the aluminum film. Thus, a single crystal free standing substrate of gallium nitride was prepared.

The surface of the single crystal substrate of gallium nitride was observed by atomic force microscopy to measure the density of surface pits. As a result, the density was as low as $4\times10^4$ pits/cm$^2$, confirming that the single crystal substrate of gallium nitride had high crystallinity.

Example 8

A silicon (111) substrate having a diameter of 50.8 mm (about 2 in.) was provided as a starting substrate and was placed in an MOCVD furnace, and an aluminum film was deposited as a metal film at a substrate temperature of 400° C. on the surface of silicon substrate in a hydrogen atmosphere while flowing TMA to a thickness of 0.2 μm. Subsequently, in the same furnace, the substrate temperature was raised to 600° C., and a gallium nitride film was grown using TMA and ammonia as starting materials on the surface of the aluminum film to a thickness of 0.1 μm. Further, the substrate temperature was raised to 1050° C., and a gallium nitride film was grown using TMG and ammonia as starting materials to a thickness of 1 μm on the substrate.

This substrate was transferred into an HVPE furnace, and gallium nitride was deposited on the surface of the substrate to a thickness of 300 μm. On this case, ammonia and gallium chloride were used as starting materials for the growth. The growth was carried out under conditions of pressure= atmospheric pressure, substrate temperature=1050° C., and growth rate=80 μm/hr.

The laminate substrate thus obtained was taken out of the HVPE furnace and was immersed in aqua regia approximately overnight to completely dissolve and remove the silicon substrate and the aluminum film. Thus, a single crystal free standing substrate of gallium nitride was prepared.

The surface of the single crystal substrate of gallium nitride was observed by atomic force microscopy to measure the density of surface pits. As a result, the density was as low as $5\times10^4$ pits/cm$^2$, confirming that the single crystal substrate of gallium nitride had high crystallinity.

Example 9

A silicon (111) substrate having a diameter of 50.8 mm (about 2 in.) was provided as a starting substrate, and a silver film was vapor deposited as a metal film on the substrate to a thickness of 0.1 μm. This substrate was placed in a MOCVD furnace, where the substrate was heated in a hydrogen atmosphere at 650° C. for 30 min to clean the surface of the substrate and, at the same time, to improve the degree of orientation. Subsequently, an aluminum nitride film was grown in the same furnace using TMA and ammonia as starting materials at a temperature of 650° C. to a thickness of 0.02 μm on the surface of the silver film. Further, the substrate temperature was raised to 1050° C., and an aluminum nitride film was grown using TMA and ammonia as starting materials to a thickness of 1 μm. Next, the starting materials were changed to TMG and ammonia, and a gallium nitride film was grown to a thickness of 1 μm.

This substrate was transferred into an HVPE furnace, and gallium nitride was deposited on the surface of the substrate to a thickness of 400 μm. In this case, ammonia and gallium chloride were used as starting materials for the growth. The growth was carried out under conditions of pressure= atmospheric pressure, substrate temperature=1050° C., and growth rate=80 μm/hr.

The laminate substrate thus obtained was taken out of the HVPE furnace and was immersed in nitric acid approximately overnight to completely dissolve and remove the silver film. Thus, a single crystal free standing substrate of gallium nitride was prepared.

The surface of the single crystal substrate of gallium nitride was observed by atomic force microscopy to measure the density of surface pits. As a result, the density was as low as $1\times10^5$ pits/cm$^2$, confirming that the single crystal substrate of gallium nitride had high crystallinity.

Example 10

An SOI (silicon on insulator) substrate, which has a diameter of 50.8 mm (about 2 in.) and has a surface having (111) crystallographic orientation, was provided as a starting substrate and was placed in an MBE furnace (not shown). In this furnace, the substrate temperature was raised to 400° C., and an aluminum film was deposited as a metal film on the substrate to a thickness of 50 nm. Thereafter, plasma cracked nitrogen was introduced into the same furnace to nitrify only the surface of the aluminum film.

This substrate was placed in an HVPE furnace, and gallium nitride was deposited on the surface of the substrate to a thickness of 300 μm. In this case, ammonia and gallium chloride were used as starting materials for the growth. The growth was carried out under conditions of pressure=atmospheric pressure, substrate temperature=1050° C., and growth rate=80 μm/hr.

The laminate substrate thus obtained was immersed in a mixed liquid composed of hydrochloric acid and aqueous hydrogen peroxide. As a result, the aluminum film was preferentially etched, and the gallium nitride layer was separated from the SOI substrate. The single crystal free standing substrate of gallium nitride thus obtained was measured for the level of warpage. As a result, the radius of curvature of the warpage of the substrate was about 4 m, confirming that the substrate was very flat.

Example 11

A silicon (111) substrate having a diameter of 76.2 mm (about 3 in.) was provided as a starting substrate, and an aluminum film was deposited as a metal film on the substrate by means of a sputtering device (not shown) to a thickness of 0.1 μm. This substrate was placed in an HVPE furnace, wherein the deposited substrate was heated in an ammonia atmosphere at 600° C. for 10 min to nitride only the surface of the aluminum film. Subsequently, gallium nitride was deposited to a thickness of 350 μm. In this case, ammonia and gallium chloride were used as starting materials for the growth. The growth was carried out under conditions of pressure=atmospheric pressure, substrate temperature=1050° C., and growth rate=80 μm/hr. During the growth, dichlorosilane was flowed as a dopant gas to dope silicon into the gallium nitride crystal.

The laminate substrate thus obtained was taken out of the HVPE furnace and was immersed in aqua regia overnight to completely dissolve and remove the silicon substrate and the aluminum film. Thus, a single crystal free standing substrate of gallium nitride was prepared.

The carrier density of the single crystal substrate of gallium nitride was measured and was found to be $8 \times 10^{18}$ cm$^{-3}$. Thus, it was confirmed that a high-carrier density, n-type gallium nitride single crystal substrate was prepared.

Example 12

A single crystal gallium nitride substrate having a diameter of 50.6 mm (about 2 in.) produced by the method described in Example 2 was provided as a starting substrate, and a gold film was vapor deposited as a metal film on the single crystal gallium nitride substrate to a thickness of 0.1 μm. This deposited substrate was placed in an MOCVD furnace, and an aluminum nitride film was grown at a substrate temperature of 850° C. using TMA and ammonia as starting materials on the substrate to a thickness of 0.1 μm. Further, the substrate was heated to a temperature of 1050° C., and the starting materials were changed to TMG and ammonia, followed by the growth of gallium nitride on the substrate to a thickness of 2 μm.

Next, this substrate was transferred into an HVPE furnace, and gallium nitride was deposited on the surface of the substrate to a thickness of 300 μm. In this case, ammonia and gallium chloride were used as starting materials for the growth. The growth was carried out under conditions of pressure=atmospheric pressure, substrate temperature=1050° C., and growth rate=80 μm/hr.

The laminate substrate thus obtained was taken out of the HVPE furnace and was immersed in aqua regia overnight to dissolve and remove the gold film, whereby the underlying gallium nitride substrate could be separated from an epitaxially grown thick gallium nitride film. The surface of the single crystal substrate of gallium nitride thus newly obtained was observed by atomic force microscopy to measure the density of surface pits. As a result, the density was $1 \times 10^5$ pits/cm$^2$, confirming that the number of pits was smaller than that in the underlying substrate and the repeated application of the production process according to the invention could provide a single crystal substrate of gallium nitride having higher crystallinity.

Example 13

Figure 2:
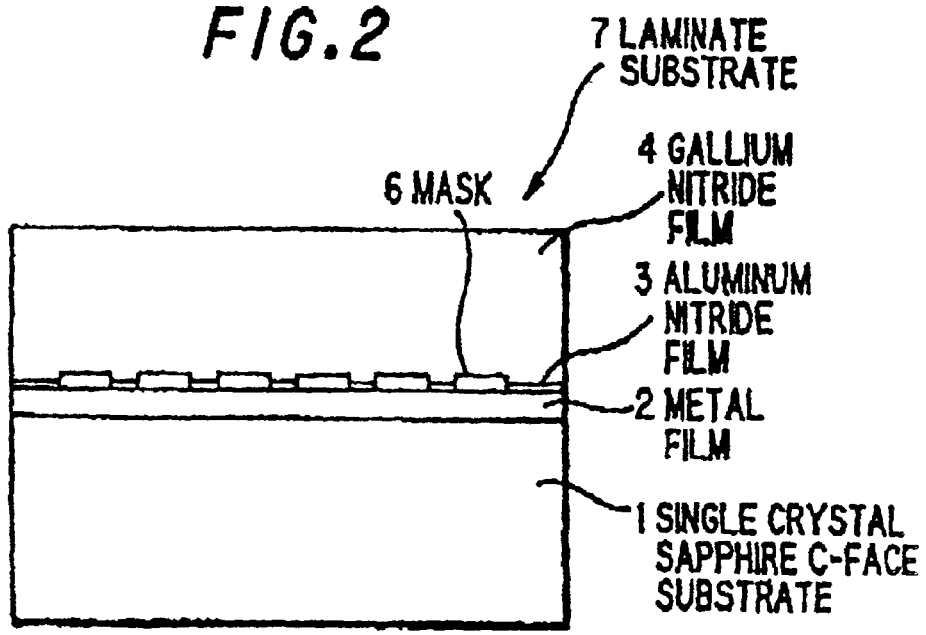
FIG. 2 is a cross-sectional view showing another preferred embodiment of an epitaxially grown gallium nitride laminate substrate to which the production process of a gallium nitride crystal substrate according to the invention has been applied.

FIG. 2 is a cross-sectional view showing another preferred embodiment of a gallium nitride. Epitaxial laminate substrate to which the production process of a gallium nitride crystal substrate according to the invention has been applied. In FIGS. 1 and 2, like members were identified with the same reference numerals.

A single crystal sapphire C-face substrate 1 having a diameter of 50.8 mm (about 2 in.) was provided as a starting substrate, and a gold film 2 was vapor deposited as a metal film on the substrate to a thickness of 300 nm. An SiO$_2$ film 6 was deposited on the substrate by thermal CVD to a thickness of 0.5 μm and stripe windows parallel to <11–20> were formed by photolithography in the SiO$_2$, film to expose the gold film 2. The width of the windows was about 3 μm, and the width of the mask was about 7 μm. This substrate was placed in an MOCVD furnace. In this furnace, an aluminum nitride film 3 was grown using TMA and ammonia as starting materials at a substrate temperature of 800° C. on the surface of the gold film 2 to a thickness of 100 nm. Further, the substrate temperature was raised to 1050° C., and a gallium nitride firm 4 was grown using TMG and ammonia as starting materials on the substrate to a thickness of 1 μm. Gallium nitride was first selectively grown on the window portion, and after the windows of the mask 6 were filled with the gallium nitride, gallium nitride was laterally grown on the mask to cover the whole surface of the substrate. Finally, a gallium nitride film having a flat surface was formed.

This substrate was transferred into an HVPE furnace, and gallium nitride was further deposited on the surface of the substrate to a thickness of 300 μm. In this case, ammonia and gallium chloride were used as starting materials for the growth. The growth was carried out under conditions of pressure=atmospheric pressure, substrate temperature=1050° C., and growth rate=80 μm/hr. After the completion of the growth, a laminate substrate 7 shown in FIG. 2 was provided.

The laminate substrate 7 thus obtained was taken out of the HVPE furnace and was immersed in aqua regia to dissolve and remove the gold film 2, whereby the single crystal sapphire C-face substrate 1 was separated from the gallium nitride film 4. The SiO$_2$ mask 6, which had been embedded in the gallium nitride film 4 on its substrate 1 side, was removed by mechanical polishing with diamond abrasive grains. Thus, a single crystal free standing substrate 4 of gallium nitride was prepared.

The surface of the single crystal substrate 4 of gallium nitride was observed by atomic force microscopy to measure the density of surface pits. As a result, the density was as low as $1\times10^4$ pits/cm$^2$, confirming that the single crystal substrate of gallium nitride had high crystallinity.

Example 14

Figure 3:
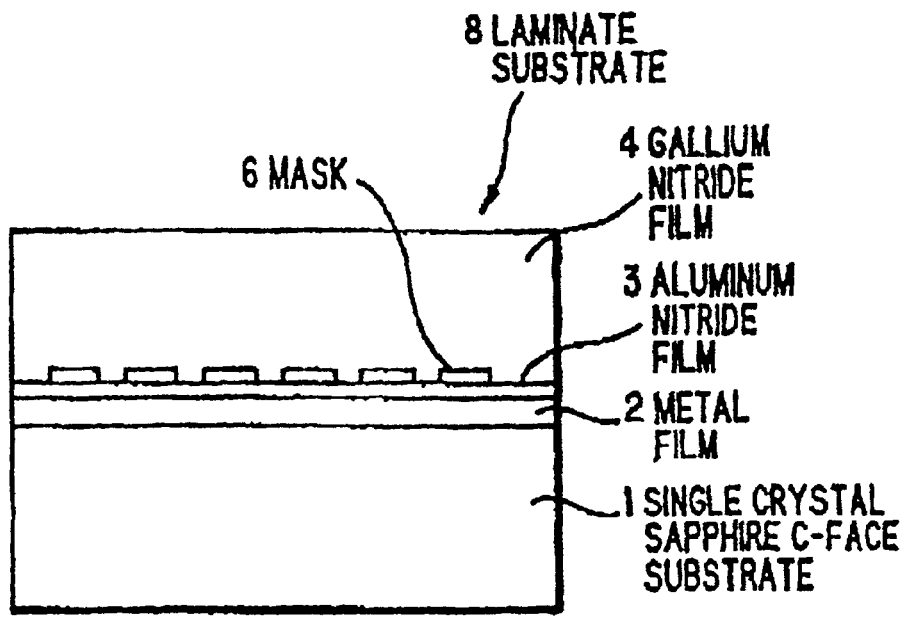
FIG. 3 is a cross-sectional view showing still another preferred embodiment of an epitaxially grown gallium nitride laminate substrate to which the production process of a gallium nitride crystal substrate according to the invention has been applied.

FIG. 3 is a cross-sectional view showing still another preferred embodiment of a gallium nitride epitaxial laminate substrate to which the production process of a gallium nitride crystal substrate according to the invention has been applied.

A single crystal sapphire C-face substrate 1 having a diameter of 50.8 mm (about 2 in.) was provided as a starting substrate, and a silver film 2 was deposited as a metal film by sputtering on the substrate to a thickness of 200 nm. This substrate was placed in an MOCVD furnace. In this furnace, an aluminum nitride film 3 was grown using TMA and ammonia as starting materials at a substrate temperature of 800° C. on the surface of the silver film 2 to a thickness of 150 nm. Subsequently, the substrate temperature was raised to 1050° C., and a gallium nitride film was grown using TMG and ammonia as starting materials on the substrate to a thickness of 1 μm. An SiO$_2$ film 6 was deposited on the substrate by PCVD to a thickness of 0.6 μm, and stripe windows parallel to <1–100> were formed by photolithography in the SiO$_2$ film to expose the gallium nitride film. The width of the windows was about 2 μm, and the width of the mask was about 8 μm. This substrate was transferred into an HVPE furnace. In this furnace, gallium nitride 4 was deposited on the surface of the substrate to a thickness of 300 μm. In this case, ammonia and gallium chloride were used as starting materials for the growth. The growth was carried out under conditions of pressure=atmospheric pressure, substrate temperature=1050° C., and growth rate=100 μm/hr. After the completion of the growth, a laminate substrate 8 shown in FIG. 3 was provided.

The laminate substrate 8 thus obtained was taken out of the HVPE furnace and was immersed in hot sulfuric acid to dissolve and remove the silver film 2, whereby the single crystal sapphire C-face substrate 1 was separated from the gallium nitride film 4. Thus, a single crystal free standing substrate 4 of gallium nitride was prepared. The surface of the single crystal substrate 4 of gallium nitride was observed by atomic force microscopy to measure the density of surface pits. As a result, the density was as low as $2\times10^4$ pits/cm$^2$, confirming that the single crystal substrate of gallium nitride had high crystallinity.

Example 15

Figure 4:
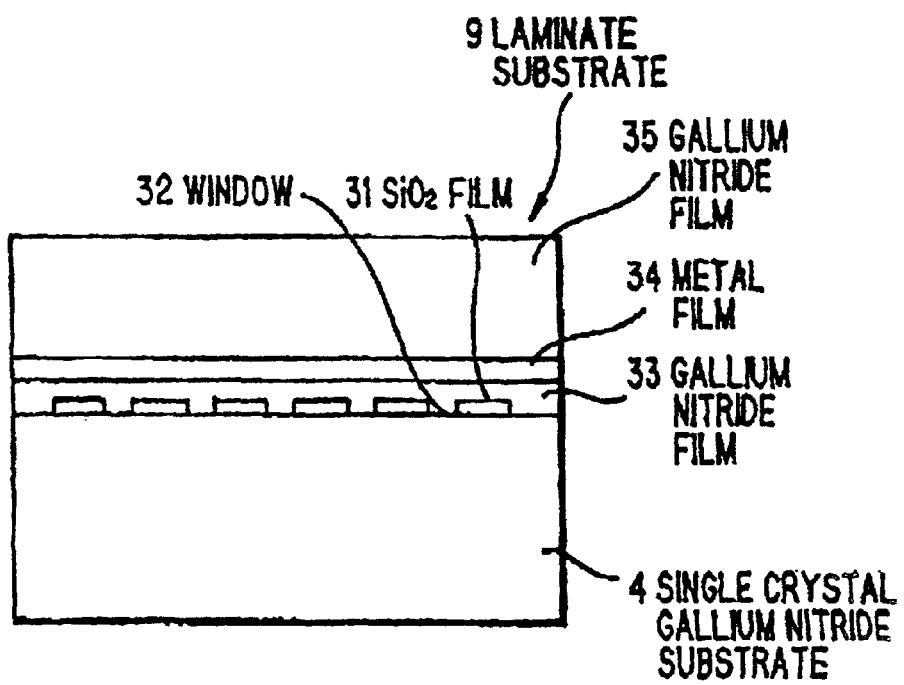
FIG. 4 is a cross-sectional view showing a further preferred embodiment of an epitaxially grown gallium nitride laminate substrate to which the production process of a gallium nitride crystal substrate according to the invention has been applied.

FIG. 4 is a cross-sectional view showing a further preferred embodiment of a gallium nitride epitaxial laminate substrate to which the production process of a gallium nitride crystal substrate according to the invention has been applied.

A single crystal gallium nitride substrate 4 having a diameter of 50.8 mm (about 2 in.) produced by the method described in Example 2 was provided as a starting substrate, and an SiO$_2$ film 31 was deposited on the single crystal gallium nitride substrate 4 by thermal CVD to a thickness of 0.5 μm, and stripe windows 32 parallel to <11–20> were formed by photolithography in the SiO$_2$ film 31 to expose the surface of the gallium nitride substrate. The width of the windows 32 was about 3 μm, and the width of the mask of the SiO$_2$ film 31 was about 7 μm.

This substrate was placed in an MOCVD furnace, In this furnace, the substrate temperature was raised to 1050° C., and a gallium nitride film 33 was grown using TMG and ammonia as starting materials to a thickness of 2 μm. Gallium nitride was first selectively grown on the windows 32, and after the windows of the mask were filled with the gallium nitride, gallium nitride was laterally grown on the task to cover the whole surface of the substrate. Finally, a gallium nitride film 33 having a flat surface was formed. A gold film 34 was vapor deposited as a metal film on the substrate to a thickness 0.1 μm. This deposited substrate was then placed in an HVPE furnace, and gallium nitride 35 was deposited on the surface of the substrate to a thickness of 300 μm. In this case, ammonia and gallium chloride were used as starting materials for the growth. The growth was carried out under conditions of pressure=atmospheric pressure, substrate temperature=1050° C., and growth rate= 80 μm/hr. After the completion of the growth, a laminate substrate 9 was provided.

The laminate substrate 9 thus obtained was taken out of the HVPE furnace and was immersed in aqua regia overnight to dissolve and remove the gold film 34, whereby the underlying epitaxially grown gallium nitride substrate 4 could be separated from the gallium nitride film 35 epitaxially grown by HVPE. The surface of the single crystal substrate 35 of gallium nitride was observed by atomic force microscopy to measure the density of surface pits As a result, the density was as low as $1\times10^5$ pits/cm$^2$, confirming that the single crystal substrate 35 of gallium nitride had high crystallinity.

Example 16

A substrate having an LD structure was prepared by forming a silicon-doped (n=$5\times10^{17}$ cm$^{-3}$) n-type GaN buffer layer (thickness=about 2.0 μm) 10, a silicon-doped (n=$5\times10^{17}$ cm$^{-3}$) n-type Al$_{0.07}$Ga$_{0.93}$N cladding layer (thickness=about 1.0 μm) 11, a silicon-doped (n=$1\times10^{17}$ cm$^{-3}$) n-type GaN SCH layer (thickness=about 0.1 μm) 12, a silicon-doped (or undoped) In$_{0.2}$Ga$_{0.8}$N/In$_{0.05}$Ga$_{0.95}$N multiple quantum well layer (30 angstroms/50 angstroms×3) 13, a magnesium-doped (p=$2\times10^{19}$ cm$^{-3}$) p-type Al$_{0.2}$Ga$_{0.91}$N overflow preventive layer (thickness=about 0.02 μm) 14, a magnesium-doped (p=$2\times10^{19}$ cm$^{-3}$) p-type GaN optical confinement layer (thickness=about 0.1 μm) 15, a magnesium-doped (p=$2\times10^{19}$ cm$^{-3}$) p-type Al$_{0.07}$Ga$_{0.93}$N cladding layer (thickness=about 0.5 μm) 16, and a magnesium-doped (p=$2\times10^{19}$ cm$^{-3}$) p-type GaN contact layer (thickness=about 0.05 μm) 17 in that order on the n-type gallium nitride single crystal, free standing substrate 35 prepared in the production process described in Example 15.

Figure 5:
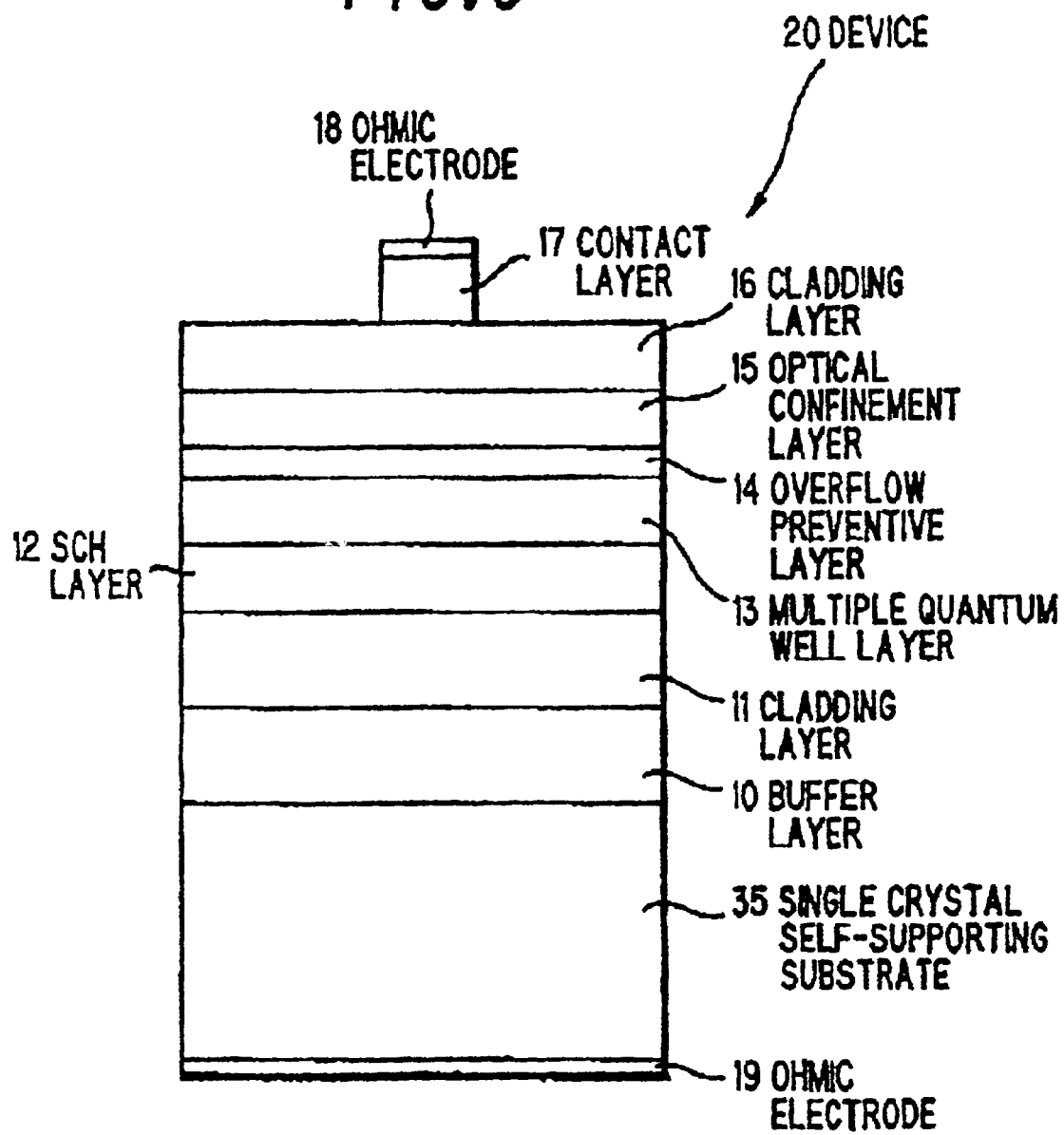
FIG. 5 is a cross-sectional view showing one preferred embodiment of a light emitting device using the gallium nitride crystal substrate according to the invention.

Thereafter, as shown in FIG. 5, the substrate having an LD structure on its p-side was subjected to dry etching to form a ridge structure having a width of about 4 μm and a depth of about 0.4 μm for current constriction. Further, a nickel/gold electrode was formed as a p-type ohmic electrode 18 on the top of the ridge. A titanium/aluminum electrode was formed as an n-type ohmic electrode 19 on the whole surface of the substrate having an LD structure on its free standing GaN substrate side. Further, a highly reflective coating (not shown) of TiO$_2$/SiO$_2$ was formed on both end faces. The length of the device 20 was 500 μm. This device 20 was energized. As a result, continuous oscillation took place at room temperature at a threshold current density of 4.5 κA/cm$^2$ and a threshold voltage of 5.5 V. Further, by virtue of reduced crystal defect, when the device 20 was driven under conditions of 25° C. and 30 mW, the service life of the device 20 was as long as 5000 hr. Furthermore, by virtue of reduced warpage of the substrate, the use of the free standing substrate according to the invention could realize a significant improvement in yield at the time of processing, and good characteristics could be provided in not less than 80% of devices.

FIG. 5 is a cross-sectional view showing one preferred embodiment of a light emitting device using the gallium nitride crystal substrate according to the invention.

Next, optimal conditions will be described.

The thickness of the metal film grown on the substrate is preferably in the range of 10 to 1000 nm. The reason for this is as follows. When the thickness of the metal film is less than 10 nm, it becomes difficult for the metal film to cover the whole surface of the substrate. In this case, this renders the nucleation of gallium nitride crystal grown on the metal film uneven, resulting in deteriorated crystallinity of the gallium nitride film. On the other hand, the thickness of the metal film exceeds 1000 nm, the orientation of the metal film is disturbed, resulting in deteriorated crystallinity of the gallium nitride film grown on the metal film. Further, when the thickness of the metal film is less than 10 nm, the substrate cannot be separated from the gallium nitride layer without difficulty.

The thickness of the gallium nitride film grown on the metal film is preferably not less than 50 $\mu$m. The reason for this is that, after the removal of the substrate, when the gallium nitride film is used as a free standing substrate, a thickness of the gallium nitride film of less than 50 $\mu$m leads to a lack of mechanical strength which is likely to cause cracking and is likely to cause deformation such as warpage.

Here the use of the metal film as a buffer layer can significantly reduce strain derived from a difference in a lattice constant or a coefficient of thermal expansion between the substrate and gallium nitride. In order to reduce the defect density in gallium nitride, however, a lattice constant and a coefficient of thermal expansion of the substrate closer to gallium nitride provide better results. Accordingly, when the invention is again practiced using as the substrate the gallium nitride, free standing substrate produced according to the invention, a gallium nitride, free standing substrate having lower defect density can be provided.

When the metal film is formed of aluminum, the nitride crystal, which is first grown on the aluminum film is preferably grown at a temperature of 660° C. or below. When the aluminum film is heated at a temperature of 660° C. or above, aluminum is melted, leading to disturbance of the orientation. In this case, a single crystal nitride film cannot be grown on the aluminum film. Once the nitride film is deposited on the metallic aluminum film, even when the aluminum film is melted, the crystallinity of the gallium nitride film grown thereon is not disturbed. For the same reason as described above, the growth temperature of the nitride crystal, which is first grown on the metal film, is preferably below the melting point of the metal.

The gallium nitride film is preferably grown by HVPE (hydride vapor phase epitaxy), because the crystal growth rate is high and a thick film can be easily formed. However, other methods such as MOCVD (metal-organics chemical vapor deposition) may be used. Further, a method comprising a combination of a plurality of growth methods may be used. For example, a method may be adopted wherein a part of the gallium nitride film is grown by MOCVD and the gallium nitride film is then grown to large thickness by HVPE.

In the above preferred embodiments, a single crystal sapphire C-face substrate or a silicon (111) substrate was used. Alternatively, a single crystal silicon carbide C-face substrate or a polycrystalline silicon carbide C-axis oriented substrate may also be used. In addition to silicon, germanium (Ge), GaAs, GaP, InP and the like may be used for the single crystal semiconductor substrate. Instead of gallium nitride grown on the metal film, a single crystal, free standing substrate of a ternary compound crystal, such as aluminum gallium nitride or gallium indium nitride, may be prepared.

This can also be applied to the preparation of a p-type gallium nitride substrate doped with magnesium or the like. An alloy film of NiAl, NiGa, CoAl, CoGa or the like may be used instead of the film of an elemental an elemental metal. A method may be adopted wherein an element having surfactant effect, such as silicon, is first adsorbed onto the surface of the metal film and the gallium nitride film is then grown to further reduce the defect density. Regarding selective growth using the mask, for example, dotted windows or checkered windows may be used instead of stripe windows. A method may be adopted wherein the metal film per se is patterned and gallium nitride is selectively grown on the metal film to reduce the defect density in the gallium nitride.

The gallium nitride crystal substrate according to the invention may be used as a substrate for gallium nitride devices, In particular, when the gallium nitride crystal substrate according to the invention is used as a substrate for laser diodes, since a good gallium nitride crystal having low defect density can be provided, a highly reliable laser diode can be realized.

As described above, according to the invention,
(1) since the substrate can be easily removed, a free standing substrate of a single crystal of gallium nitride having a large size and a uniform shape can be easily formed;
(2) since the substrate can be easily removed, a free standing substrate of a single crystal of gallium nitride free from crack and damage can be easily prepared;
(3) since the metal film can reduce strain derived from a difference in lattice constant and a difference in coefficient of thermal expansion between the basal substrate and the gallium nitride film, a free standing substrate of a single crystal of gallium nitride having low defect density and good crystal quality can be prepared;
(4) a free standing substrate of a single crystal of gallium nitride can be prepared using environmentally friendly materials and methods; and
(5) a light emitting device having high output and long service life can be prepared on a free standing substrate of a single crystal of gallium nitride having low defect density and good crystal quality.

In summary, the invention can realize a process for producing, in a simple manner, a gallium nitride crystal substrate, which has low defect density and has not been significantly contaminated with impurities, and a gallium nitride crystal substrate produced by the production process.

The invention has been described in detail with particular reference to preferred embodiments, but it will be understood that variations and modifications can be effected within the scope of the invention as set forth in the appended claims.

What is claimed is:

1. A process for producing a gallium nitride crystal substrate, comprising the steps of:
   depositing a metal film on a starting substrate to cover the whole surface of the substrate, and said starting substrate being any one of a single crystal sapphire substrate, a substrate comprising a single crystal gallium nitride film grown on a sapphire substrate, and a single crystal semiconductor substrate;

depositing a gallium nitride film on the metal film to form a laminate substrate; and removing the starting substrate from the laminate substrate with the gallium nitride film deposited thereon to prepare a free standing gallium nitride crystal substrate.

2. A process for producing a gallium nitride crystal substrate, comprising the steps of:

depositing a metal film on a starting substrate, which is any one of a single crystal sapphire substrate, a substrate comprising a single crystal gallium nitride film grown on a sapphire substrate, and a single crystal semiconductor substrate;

forming a mask region and a gallium nitride selective growth region formed of a patterned mask material on the metal film;

depositing, using the selective growth region as an origin, a gallium nitride film on the selective growth region and the mask region to form a laminate substrate; and removing the starting substrate from the laminate substrate with the gallium nitride film deposited thereon to prepare a free standing gallium nitride crystal substrate.

3. A process for producing a gallium nitride crystal substrate, comprising the steps of:

depositing a metal film on a starting substrate, which is any one of a single crystal sapphire substrate, a substrate comprising a single crystal gallium nitride film grown on a sapphire substrate, and a single semiconductor crystal substrate;

depositing a gallium nitride film on the metal film;

forming a mask region and a gallium nitride selective growth region formed of a patterned mask material on the gallium nitride film;

again depositing, using the selective growth region as an origin, a gallium nitride film on the selective growth region and the mask region to form a laminate substrate; and removing the starting substrate from the laminate substrate with the gallium nitride film again deposited thereon to prepare a free standing gallium nitride crystal substrate.

4. A process for producing a gallium nitride crystal substrate, comprising the steps of:

forming a mask region and a gallium nitride selective growth region formed of a patterned mask material on a starting substrate, which is any one of a single crystal sapphire substrate, a substrate comprising a single crystal gallium nitride film grown on a sapphire substrate, and a single crystal semiconductor substrate;

depositing, using the selective growth region as an origin, a gallium nitride film on the selective growth region and the mask region;

forming a metal film on the gallium nitride film;

again depositing a gallium nitride film on the metal film to form a laminate substrate; and removing the starting substrate from the laminate substrate with the gallium nitride film again deposited thereon to prepare a free standing gallium nitride crystal substrate.

5. The process according to any one of claims 1 to 4, which uses, as the starting substrate, the free standing gallium nitride crystal substrate produced by the process according to any one of claims 1 to 4.

6. The process according to claim 1, wherein the metal film is a metal film having C-axis orientation.

7. The process according to claim 1, wherein the metal film is formed of a member selected from the group consisting of aluminum, gold, silver, copper, platinum, iron, nickel, titanium, zirconium, and hafnium and alloys containing any one of said metals.

8. The process according to claim 1, wherein the metal film has a thickness in the range of 10 to 1000 nm.

9. The process according to claim 1, wherein the gallium nitride is deposited to a thickness of not less than 50 μm on the metal film.

10. The process according to claim 1, wherein aluminum nitride is deposited on the metal film and gallium nitride is deposited on the aluminum nitride.

11. The process according to claim 1, wherein a part or the whole of the step of depositing gallium nitride is carried out by HVPE (hydride vapor phase epitaxy).

12. The process according to claim 1, wherein the step of removing the starting substrate separating separates the gallium nitride film from the substrate through the metal film.

13. The process according to claim 12, wherein the gallium nitride film is separated from the metal film by etching.

14. A free standing gallium nitride crystal substrate produced by the process according to claim 1.

* * * * *